United States Patent [19]

Shimano

[11] Patent Number: 5,249,215
[45] Date of Patent: Sep. 28, 1993

[54] X-RAY EXPOSURE SYSTEM WITH CURVED REFLECTING MIRRORS

[75] Inventor: Hiroki Shimano, Hyogo, Japan

[73] Assignee: Mitsubishi Denki Kabushiki Kaisha, Tokyo, Japan

[21] Appl. No.: 848,312

[22] Filed: Mar. 9, 1992

[30] Foreign Application Priority Data

May 13, 1991 [JP] Japan .................. 3-106171

[51] Int. Cl.$^5$ .................. G03B 7/00; G01M 11/00
[52] U.S. Cl. ............................ 378/34; 378/84; 378/147; 250/492.1
[58] Field of Search ............ 378/34, 35, 84, 43, 378/70, 119, 145, 137; 250/492.2, 491.1, 305, 306

[56] References Cited

U.S. PATENT DOCUMENTS

| | | | |
|---|---|---|---|
| 5,003,567 | 3/1991 | Hawryluk et al. | 378/34 |
| 5,027,377 | 6/1991 | Thoe | 378/145 |
| 5,031,199 | 7/1991 | Cole, III et al. | 378/34 |
| 5,123,036 | 6/1992 | Uno et al. | 378/34 |
| 5,127,029 | 6/1992 | Suzuki et al. | 378/34 |
| 5,138,158 | 8/1992 | Ninomiya et al. | 250/306 |
| 5,142,561 | 8/1992 | Doumas | 378/34 |

OTHER PUBLICATIONS

H. Betz, High Resolution Lithography Using Synchrotron Radiation, *Nuclear Instruments and Methods in Physics Research*, A246, (1986), pp. 658-667, North-Holland.

*Primary Examiner*—David P. Porta
*Assistant Examiner*—Kim-Kwok Chu
*Attorney, Agent, or Firm*—Burns, Doane, Swecker & Mathis

[57] ABSTRACT

X-ray exposure equipment which can effectively converge a synchrotron radiation, which tends to diverge to a great extent in a horizontal direction, to assure a sufficiently high intensity on a lithographic plane and can irradiate X-rays perpendicularly to a full lateral extent of the lithographic plane over an entire exposure area. The X-ray exposure equipment comprises a point X-ray source and a first reflecting mirror having first and second point focuses and disposed such that the first focal point coincides with the location of the X-ray source so as to focus X-rays to the second focal point. A second reflecting mirror is disposed such that the focus thereof substantially coincides with the second focal point of the first reflecting mirror so as to collimate X-rays received from the first reflecting mirror by way of the focusing property thereof in parallel to a principal optical axis of an optical system for X-rays which includes the first and second reflecting mirrors. The parallel X-rays from the second reflecting mirror are irradiated perpendicularly to a lithographic plane.

3 Claims, 4 Drawing Sheets

X-RAY EXPOSURE SYSTEM WITH CURVED REFLECTING MIRRORS

BACKGROUND OF THE INVENTION

1. Field of the Invention

This invention relates to X-ray exposure equipment, and more particularly to X-ray exposure equipment which makes use of, for example, synchrotron radiation.

2. Description of the Prior Art

Synchrotron radiation radiated from a storage ring serves as a source of X-rays which radiates in a fan-shaped-beam having a broad band spectrum, the wavelength of which ranges from hard X-rays to visible light. Such a beam has a large divergence angle in a horizontal direction but has a small divergence angle in a vertical direction. X-ray exposure equipment which makes use of such synchrotron radiation as a source of X-rays is already known and disclosed, for example, in *Nuclear Instruments and Methods in Physics Research*, A246, 1986, pp. 658–667. The X-ray exposure equipment is shown in FIG. 6.

Referring to FIG. 6, the X-ray exposure equipment consists of an X-ray source 1 in the form of a point light source for radiating therefrom X-rays having divergence angles in the horizontal and vertical directions, a vacuum window 4 formed, for example, from a beryllium film, a lithographic plane 5, and a plane X-ray reflecting mirror 8.

In operation, the plane X-ray reflecting mirror 8 intercepts hard X-rays while the vacuum window 4 formed from a beryllium film or the like intercepts a long wavelength band longer than several tens of angstroms. The plane X-ray reflecting mirror 8 and the vacuum window 4 constitute an X-ray optical system. Thus, X-rays of a wavelength band around 10 angstroms which is appropriate for the X-ray lithography can be extracted from the X-ray optical system.

Conventional X-ray exposure equipment is constructed in a manner such as that described above. In conventional X-ray exposure equipment, an aperture of the X-ray optical system with respect to the point light source 1 depends upon the size of the vacuum window 4 located on the downstream side, and accordingly, it cannot have a large size. Consequently, only very small part of the synchrotron radiation which spreads to a great extent in a horizontal direction can be extracted to the lithographic plane 5. Particularly, when synchrotron radiation from a compact storage ring for semiconductor device production is utilized, the intensity of a synchrotron radiation is not high, and accordingly, there is a problem that a sufficiently high intensity of X-rays cannot be assured on the lithographic plane 5.

Further, synchrotron radiation is irradiated upon the lithographic plane 5 while maintaining the synchrotron radiation's divergence angle. Consequently, as the distance from the original point on the lithographic plane 5 which is defined as an interception point of the principal optical axis of the X-ray optical system and the lithographic plane 5 increases particularly in a horizontal direction, displacement of incidence of X-rays to the lithographic plane 5 from normal incidence increases progressively. Accordingly, there is another problem that displacement of a replicated pattern on the lithographic plane 5 from an X-ray mask pattern increases as the distance from the original point increases in a horizontal direction.

SUMMARY OF THE INVENTION

It is an object of the present invention to provide X-ray exposure equipment which can effectively converge synchrotron radiation, which tends to diverge to a great extent in a horizontal direction, to assure a sufficiently high intensity on a lithographic plane.

It is another object of the present invention to provide X-ray exposure equipment which can irradiate X-rays perpendicularly to the full extent to a lithographic plane over an entire exposure area.

In order to attain these objects, according to the present invention, there is provided X-ray exposure equipment, which comprises an X-ray source in the form of a point source for radiating therefrom X-rays having divergence angles in a horizontal direction and a vertical direction, a first reflecting mirror having a curved reflecting surface of a shape represented by a curved surface having a light converging characteristic such that there are two focal points such as an ellipsoidal shape or a toroidal shape. The first reflecting mirror is disposed such that its first focal point coincides with the location of the point source so as to focus X-rays radiated from the X-ray source simultaneously in the horizontal and vertical directions upon the second focal point. A second reflecting mirror having a paraboloidal reflecting surface is disposed such that the focus of the paraboloidal reflecting surface thereof substantially coincides with the second focal point of the first reflecting mirror so as to collimate X-rays received from the first reflecting mirror by way of the focusing property of the paraboloidal reflecting surface in parallel to a principal optical axis of an optical system for X-rays which includes the first and second reflecting mirrors.

With X-ray exposure equipment, the X-ray source created using synchrotron radiation has such a small size that it can be regarded as a point light source the size of which is equal to a sufficiently small size of an electron beam which circulates in a storage ring. Further, since the first reflecting mirror can be located close to the point light source, the aperture of the X-ray optical system with respect to the point light source can be increased in size, and consequently, synchrotron radiation having a fan-shape and diverging to a great extent in the horizontal direction can all be gathered into and converged by the first reflecting mirror so that it may be focused to the second focal point of the first reflecting mirror. Further, since the synchrotron radiation focused to the second focal point of the first reflecting mirror can be regarded as a point light source located at the focal point of the second reflecting mirror, it is reflected and collimated in parallel to the principal optical axis by the second reflecting mirror. Consequently, X-rays passing through the vacuum window on the downstream side of the second reflecting mirror are irradiated perpendicularly to the full lateral extent of the lithographic plane over an entire exposure area.

The above and other objects, features, and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
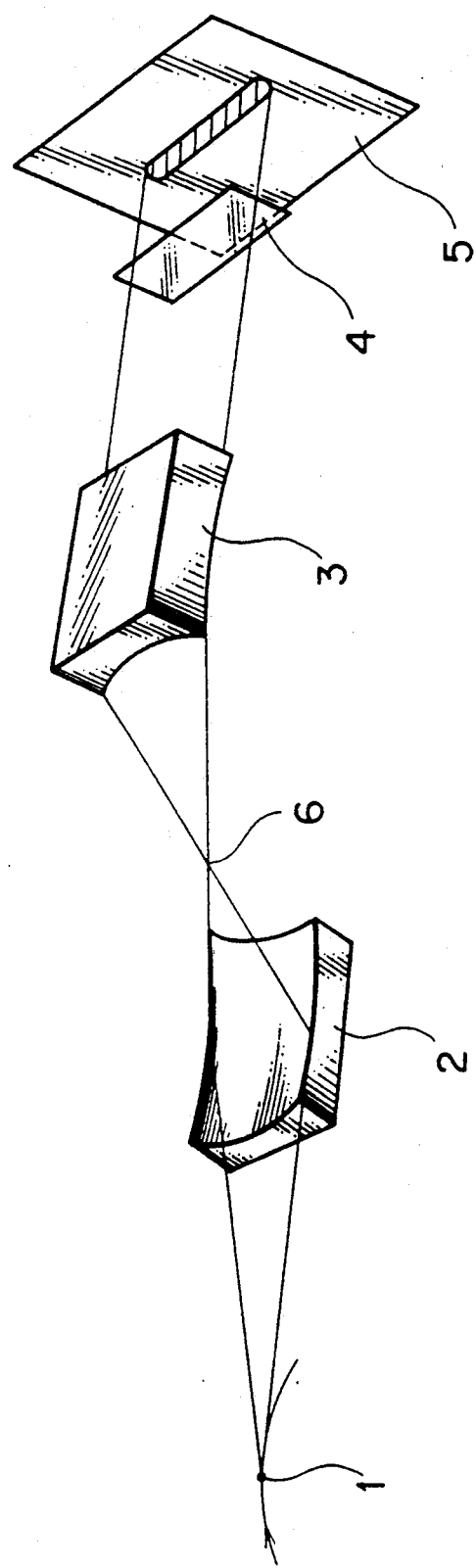
FIG. 1 is a schematic drawing of X-ray exposure equipment showing a preferred embodiment of the present invention.

Referring to FIG. 1, there is shown X-ray exposure equipment to which the present invention is applied. The X-ray exposure equipment includes an X-ray source 1 in the form of a point light source for radiating therefrom X-rays having divergence angles in a horizontal direction and a vertical direction. The X-ray source 1 may be, for example, a point light source of a synchrotron radiation. The X-ray exposure equipment further includes a first reflecting mirror 2 having a light converging function of converging synchrotron radiation from the light source point 1 simultaneously in a horizontal direction and a vertical direction to focus to a particular point denoted at 6 in FIG. 1, which is at a second focal point of the first reflecting mirror 2. The first reflecting mirror 2 has a curved reflecting surface, the shape of which is represented by a curved surface having, for example, a light converging characteristic of two focal points of an ellipsoidal shape. The X-ray exposure equipment further includes a second reflecting mirror 3 having the function of collimating synchrotron radiation converged by the first reflecting mirror 2 and diverged from the focus point 6 in parallel to the principal optical axis of the optical system which includes the first and second reflecting mirrors 2 and 3. The second reflecting mirror 3 has a focal point which coincides with the second focal point (6) of the first reflecting mirror 2. The second reflecting mirror 3 has a curved reflecting surface the shape of which is represented by a paraboloidal shape. The X-ray exposure equipment further includes a vacuum window 4 and a lithographic plane 5. Though not shown, an X-ray mask for replicating is interposed between the vacuum window 4 and the lithographic plane 5. In the X-ray exposure equipment, the first reflecting mirror 2 has a first focal point which coincides with the location of the light source point 1 while the second focal point of the first reflecting mirror 2 substantially coincides with the focal point of the second reflecting mirror 3 at the point 6.

Figure 2:
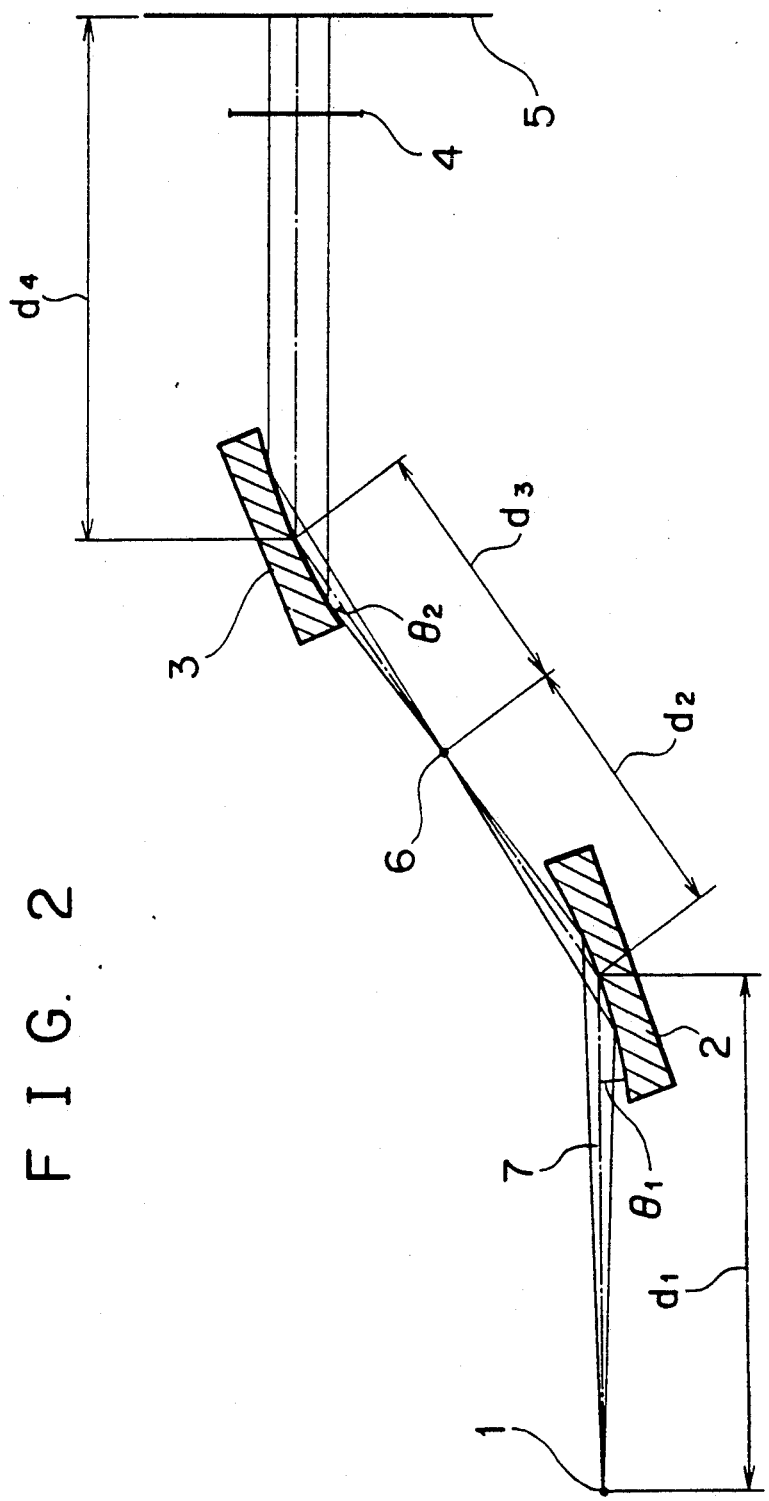
FIG. 2 is a longitudinal section showing an X-ray converging optical system of the X-ray exposure equipment of FIG. 1.

Referring now to FIG. 2, the X-ray converging optical system of the X-ray exposure equipment is shown in more detail. Reference numeral 7 denotes the principal optical axis of the X-ray converging optical system. Here and elsewhere, the point on the surface of a curved mirror intercepted by the chief ray or main optical axis will be referred to as its pole. With this definition in mind, $d_1$ is a distance from the light source point 1 of synchrotron radiation to the pole of the first reflecting mirror, $d_2$ a distance from the pole of the first reflecting mirror 2 to the second focal point 6, $d_3$ a distance from the second focal point 6 to the second reflecting mirror 3, $d_4$ a distance from the second reflecting mirror 3 to the lithographic plane 5, $\theta_1$ an incidence angle of the principal optical axis 7 to the first reflecting mirror 2, and $\theta_2$ an incidence angle of the principal optical axis 7 to the second reflecting mirror 3.

Referring to FIGS. 1 and 2, with the X-ray exposure equipment having a constitution such as that described above, the light source 1 of synchrotron radiation can be regarded as a point light source the size of which is equal to a sufficiently small size of an electron beam which circulates in a storage ring not shown. Further, the pole of the first reflecting mirror 2 can be located close to the light source point 1 so that the aperture of the X-ray optical system with respect to the light source point 1 may be increased in size. Consequently, synchrotron radiation from the light source point 1 having a fan-shape and diverging to a great extent in a horizontal direction can all be gathered into and converged by the first reflecting mirror 2 so that it may be focused to the second focal point 6. Further, since the synchrotron radiation converged to the second focal point 6 of the first reflecting mirror 2 can be regarded as a point light source located at the focal point of the second reflecting mirror 3, it is collimated in parallel to the principal optical axis 7 by the second reflecting mirror 3. Consequently, X-rays passing through the vacuum window 4 are irradiated perpendicularly to the full lateral extent of the lithographic plane over an entire exposure area 5. Besides, since a synchrotron radiation emitted from the light source point 1 is all collected in the exposure area 5, even if an influence of reflectivity of the X-ray reflecting mirror 2 and 3 when synchrotron radiation is reflected by them is taken into consideration, X-rays on the lithographic plane 5 still have an intensity equal to five to ten times or so the intensity of X-rays with conventional X-ray exposure equipments.

It is to be noted that a decrease of the distance from the light source point 1 of synchrotron radiation to the pole of the first reflecting mirror 2 will increase the size of the aperture of the X-ray optical system with respect to the light source point 1 of a synchrotron radiation, which will facilitate realization of the effect described above.

Figure 3:
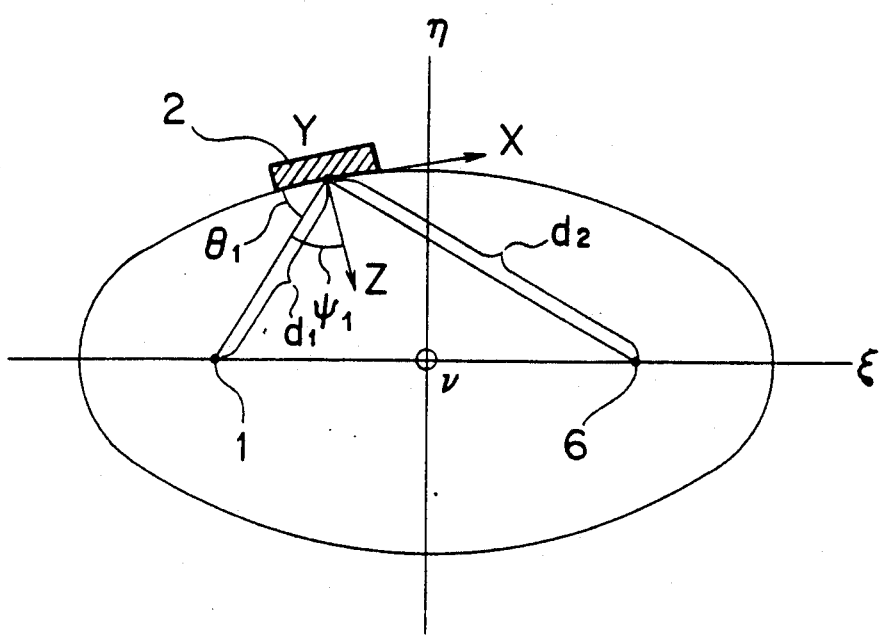
FIG. 3 is a diagrammatic drawing of a shape of a curved reflecting surface of a first reflecting mirror of the X-ray converging optical system of FIG. 2.

Referring now to FIG. 3, a shape of the curved reflecting surface of the first reflecting mirror 2 is shown. The shape of the curved reflecting surface of the first reflecting mirror 2 is represented by a curved surface of an ellipsoidal shape having two focal points given by the following expression (1):

$$\frac{\xi^2}{A^2} + \frac{\eta^2}{B^2} + \frac{\nu^2}{B^2} = 1 \tag{1}$$

where $$A = \frac{d_1 + d_2}{2}$$

and $$B = A\sqrt{(1-e^2)}$$

where e is an eccentricity and given by the following expression (2):

$$e = \frac{\sqrt{(d_1 + d_2)^2 - 4d_1d_2\cos^2\theta_1}}{2A} \tag{2}$$

-continued where $$\psi_1 = \frac{\pi}{2} - \theta_1$$

Figure 4:
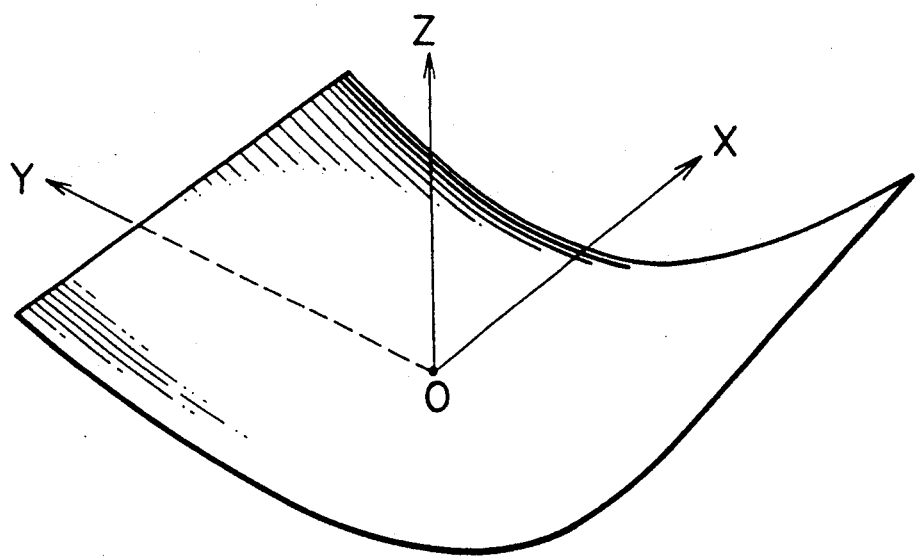
FIG. 4 is a diagrammatic drawing of the shape of the curved reflecting face of the first reflecting mirror of FIG. 3.

Then, by expanding the expression of the ellipsoidal shape in a coordinate system (x, y, z) on the curved reflecting surface of the first reflecting mirror 2 as shown in FIG. 4, the following expression (3) is obtained, taking the pole of the mirror as the origin:

$$f(X,Y,Z) = X^2 \cdot \left(\frac{\cos^2\psi_1}{B^2}\right) + \frac{Y^2}{B^2} + Z^2 \cdot \left(\frac{\sin^2\psi_1}{B^2} + \frac{1}{A^2}\right) - Z \cdot \left(\frac{4f\cos\psi_1}{B^2}\right) - ZX \cdot \left(\frac{\sqrt{e^2 - \sin^2\psi_1} \times 2\sin\psi_1}{B^2}\right) = 0 \quad (3)$$

where $$f = \left(\frac{1}{d_1} + \frac{1}{d_2}\right)^{-1}$$

Here, if the first reflecting mirror 2 has a curved surface of a shape such that the distance $d_1$ between the first focal point and the pole of the first reflecting mirror 2 is minimized, then the intensity of X-rays on the lithographic plane 5 is maximum.

Figure 5:
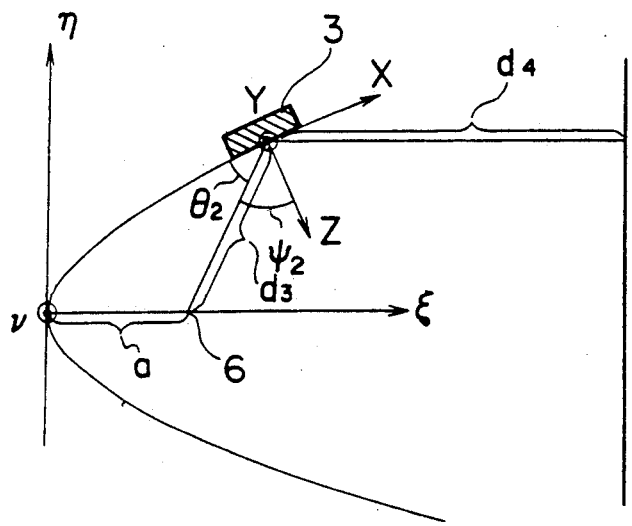
FIG. 5 is a diagrammatic drawing of a shape of a curved reflecting face of the second reflecting mirror of the X-ray converging optical system of FIG. 2.
Figure 6:
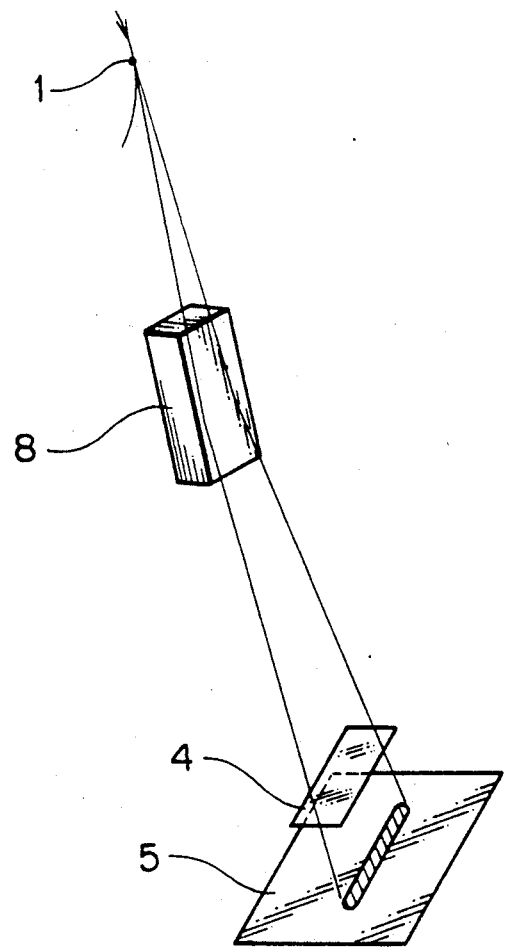
FIG. 6 is a schematic drawing of conventional X-ray exposure equipment.

Referring now to FIG. 5, there is shown a shape of the curved reflecting surface of the second reflecting mirror 3. The curved reflecting surface of the second reflecting mirror 3 is represented, for example, by a paraboloidal shape given by the following expression (4):

$$\eta^2 + \nu^2 = 4a\xi \quad (4)$$

where $$a = d_3 \cos^2 \psi_2$$

By expanding the expression (4) in a coordinate system (x, y, z) on the surface of the second reflecting mirror 3 similarly as described above, the following expression (5) is obtained:

$$f(X, Y, Z) = \cos^2\psi_2 \cdot X^2 + Y^2 + \sin^2\psi_2 \cdot Z^2 - 4a \sec \psi_2 Z - 2 \sin\psi_2 \cdot \cos\psi_2 \cdot ZX = 0 \quad (5)$$

Further, by optimizing parameters such as the incidence angles to the first and second reflecting mirrors 2 and 3, the distance between the pole and the second focal point 6 of the first reflecting mirror 2 and the distance between the second reflecting mirror 3 and the focus of the second reflecting mirror 3, the intensity distribution of X-rays on the lithographic plane can be made uniform in a horizontal direction. In other words, by optimizing the parameters $d_2$, $d_3$, $d_4$, $\theta_1$ and $\theta_2$ described hereinabove, the intensity distribution of X-rays on the lithographic plane 5 can be made uniform in a horizontal direction.

Further, as for a technique for enlarging an exposure area in a vertical direction, a mechanical scan method may be employed wherein the X-ray mask and the lithographic plane 5 are scanned together in a vertical direction.

Further, the shape of the curved reflecting surface of the first reflecting mirror 2 is not limited to such an ellipsoidal shape as described hereinabove, and it may otherwise be a different shape represented by a curved surface having a light converging characteristic such that it has two focal points, such as a toroidal shape.

Having now fully described the invention, it will be apparent to one of ordinary skill in the art that many changes and modifications can be made thereto without departing from the spirit and scope of the invention as set forth herein.

What is claimed is:

1. X-ray exposure equipment, comprising:
   an X-ray source in the form of a point source for radiating therefrom X-rays having a first divergence angle in a horizontal direction and a second divergence angle in a vertical direction, said first divergence angle being greater than said second divergence angle;
   a first reflecting mirror having a curved reflecting surface of a shape represented by a curved surface having a light converging characteristic such that said first reflecting mirror has a first focal point and a second focal point, said first reflecting mirror being disposed such that the first focal point coincides with the location of said point source so as to focus X-rays radiated from said X-ray source simultaneously in the horizontal and vertical directions to the second focal point; and
   a second reflecting mirror having a paraboloidal reflecting surface and disposed such that a focus of the paraboloidal reflecting surface thereof substantially coincides with the second focal point of said first reflecting mirror so as to collimate X-rays received from said first reflecting mirror by way of the focusing property of said paraboloidal reflecting surface in parallel to a principal optical axis of an optical system for X-rays which includes said first and second reflecting mirrors.

2. X-ray exposure equipment as claimed in claim 1, wherein said first reflecting mirror has an ellipsoidal shape.

3. X-ray exposure equipment as claimed in claim 1 wherein said first reflecting mirror has a toroidal shape.

* * * * *